United States Patent
Kim et al.

(10) Patent No.: US 9,232,660 B2
(45) Date of Patent: Jan. 5, 2016

(54) FLEXIBLE METAL CLAD LAMINATE AND MANUFACTURING METHOD THEREOF

(71) Applicant: SK Innovation Co., Ltd., Seoul (KR)

(72) Inventors: Ho Sub Kim, Seoul (KR); Yong Seok Lee, Daejeon (KR); Weon Jung Choi, Daejeon (KR); Dae Nyoun Kim, Daejeon (KR); Young Do Kim, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 8 days.

(21) Appl. No.: 14/369,128

(22) PCT Filed: Dec. 27, 2012

(86) PCT No.: PCT/KR2012/011562
§ 371 (c)(1),
(2) Date: Jun. 26, 2014

(87) PCT Pub. No.: WO2013/100627
PCT Pub. Date: Jul. 4, 2013

(65) Prior Publication Data
US 2014/0342137 A1    Nov. 20, 2014

(30) Foreign Application Priority Data

Dec. 28, 2011  (KR) .......... 10-2011-0144587
Dec. 27, 2012  (KR) .......... 10-2012-0154108

(51) Int. Cl.
*B32B 15/08*  (2006.01)
*H05K 3/02*  (2006.01)
*H05K 1/03*  (2006.01)

(52) U.S. Cl.
CPC ............. *H05K 3/022* (2013.01); *H05K 1/036* (2013.01); *H05K 1/0346* (2013.01); *H05K 1/0393* (2013.01); *H05K 2201/0154* (2013.01); *H05K 2201/068* (2013.01); *Y10T 156/10* (2015.01); *Y10T 428/24942* (2015.01)

(58) Field of Classification Search
CPC ........ B32B 15/08; B32B 7/02; B32B 27/281; B32B 225/03; H05K 2201/068
USPC ....................... 428/212, 458, 473.5
See application file for complete search history.

(56) References Cited

FOREIGN PATENT DOCUMENTS

| KR | 100607300 B1 | 7/2006 |
| KR | 100646606 B1 | 11/2006 |
| KR | 1020090066399 A | 6/2009 |
| KR | 1020100048474 A | 5/2010 |
| KR | 1020100127125 A | 12/2010 |

*Primary Examiner* — Alexander Thomas
(74) *Attorney, Agent, or Firm* — The Webb Law Firm

(57) ABSTRACT

A flexible metal clad laminate includes a metal foil, and a multilayered polyimide film including a first polyimide layer having a glass transition temperature of 300° C. or less and disposed on the metal foil, a second polyimide layer disposed on the first polyimide layer and a third polyimide layer disposed on the second polyimide layer. According to the flexible metal clad laminate of the present invention, appearance defects such as blistering generated during curing process in a continuous curing machine using an infrared heat source may be solved, interlayer delamination may be prevented due to a good adhesion strength with a metal layer, and an ACF bonding strength and a dimensional stability may be good. The flexible metal clad laminate may be useful for the manufacturing of a flexible printed circuit boards.

14 Claims, No Drawings

FLEXIBLE METAL CLAD LAMINATE AND MANUFACTURING METHOD THEREOF

CROSS-REFERENCE TO RELATED APPLICATIONS

This application is the United States national phase of International Application No. PCT/KR2012/011562 filed Dec. 27, 2012, and claims priority to Korean Patent Application Nos. 10-2011-0144587 and 10-2012-0154108, filed Dec. 28, 2011 and Dec. 27, 2012, respectively, the disclosures of which are hereby incorporated in their entirety by reference.

BACKGROUND OF THE INVENTION

1. Field of the Invention

The present invention relates to a flexible metal clad laminate and a manufacturing method thereof, and more particularly, to a flexible metal clad laminate obtained by heating polyamic acid which is a polyimide precursor at a high temperature and transforming into final polyimide, and a manufacturing method thereof.

2. Description of the Related Art

A flexible metal clad laminate used for manufacturing a flexible printed circuit board is a laminate of a conductive metal foil and an insulating resin. The flexible metal clad laminate may be processed to fine patterned circuits and bended in a narrow space. According to the trend of small sized and light weight electronic devices, the application field of the flexible metal clad laminate has been increased in a notebook computer, a portable information terminal, a small-sized video camera, a disk for storage, etc.

The flexible metal clad laminate concerning the above-described technique may be generally manufactured by a method of laminating a thermoplastic polyimide film on a polyimide film with a conductive metal foil, or a casting method including directly coating a polyamic acid solution, which is a polyimide precursor, on a metal foil. In the casting method, a heating process with a high temperature is necessary for conversion of the polyamic acid into polyimide. The casting method for manufacturing of the flexible metal clad laminate may be classified into a roll-to-roll process and a batch process according to a curing method.

In the batch process, pre- and post-processes are necessary for preventing adhesion generated between the metal foil and the polyimide during the batch curing. In addition, the batch process had a bad productivity because the length for treatment per roll is required to be short.

In the roll-to-roll process, a polyamic acid solution, a polyimide precursor, is coated on a metal foil and dried. After that, it is unrolled and the thermal curing is conducted before rewinding process. The roll-to-roll process can reduce the production time and cost, therefore, it can overcome the disadvantage of batch process which had a low productivity. However, the roll-to-roll curing is conducted during a short time. Thus, a rapid heating rate may cause defects such as blistering, delamination, a wrinkling phenomenon due to a rapid contraction/expansion, etc. These defects may be reduced by decreasing the line speed, but this can also reduce the productivity.

In general, a flexible metal clad laminate consists of one or more polyimide layers. In order to increase the productivity, a metal clad laminate of one polyimide layer may be manufactured. A metal clad laminate of two or more polyimide layers may prevent warpage and curl between a metal foil and the polymer film and may increase adhesion strength, mechanical properties, electrical properties, etc.

When manufacturing a flexible metal clad laminate using polyimide film with two or more layers, a polyimide resin making a contact with a metal foil and having a glass transition temperature of 300° C. or over may be used to restrain the generation of appearance defects after heating, as disclosed in Korean Patent Publication Nos. 10-2010-0048474 and 10-2010-0127125. However, the above-described flexible metal clad laminate has a low bonding strength with an anisotropic conductive film (ACF) used in a liquid crystal display or a touch screen, etc.

RELATED ART LITERATURE

Patent Literature (Patent literature 1) Korean Patent Publication No. 10-2010-0048474

(Patent literature 2) Korean Patent Publication No. 10-2010-0127125

SUMMARY OF THE INVENTION

An aspect of the present invention provides a flexible metal clad laminate obtained by using a thermoplastic polyimide resin at a contacting portion with a metal foil to solve defects concerning a low bonding strength with an anisotropic conductive film (ACF), and having a good appearance and good properties. The flexible metal clad laminate may have the good properties, particularly, the ACF bonding strength and a dimensional stability, and a good appearance depending on the heating condition in a continuous curing machine with infrared heat source and the coefficient of thermal linear expansion of the polyimides.

According to an aspect of the present invention, there is provided a flexible metal clad laminate including: a metal foil; and a multilayered polyimide film comprising a first polyimide layer, located on the metal foil, having a glass transition temperature of 300° C. or less, a second polyimide layer located on the first polyimide layer and a third polyimide layer located on the second polyimide layer. The multilayered polyimide film satisfies following Equation 1.

$$C2 < C1 \leq C3 \qquad \text{[Equation 1]}$$

In Equation 1, C1 represents a coefficient of thermal linear expansion of the first polyimide layer, C2 represents a coefficient of thermal linear expansion of the second polyimide layer, and C3 represents a coefficient of thermal linear expansion of the third polyimide layer.

The flexible metal clad laminate may satisfy following Equation 2 and Equation 3, and an ACF bonding strength may be 0.8 kgf/cm or over.

$$S_{MD} \leq 0.02 \qquad \text{[Equation 2]}$$

$$S_{TD} \leq 0.02 \qquad \text{[Equation 3]}$$

In Equation 2, $S_{MD}$ represents a standard deviation of a dimensional change in a machine direction (MD) after heating, and in Equation 3, $S_{TD}$ represents a standard deviation of a dimensional change in a transverse direction (TD) after heating.

The first polyimide layer may have the coefficient of thermal linear expansion of 30 to 50 ppm/K and the glass transition temperature of 200 to 300° C.

The second polyimide layer may have the coefficient of thermal linear expansion of 1 to 20 ppm/K and the glass transition temperature of 300 to 420° C.

The third polyimide layer may have the coefficient of thermal linear expansion of 30 to 70 ppm/K.

The multilayered polyimide film may be prepared by imidization with infrared heating process. The heating with an infrared heat source, the time of heating with an infrared heat source, which is conducted at 300° C. or over, is 40% or over based on a total heating time.

A flexible metal clad laminate manufactured by laminating a metal foil on the third polyimide layer included in the multilayered polyimide film may be included in the present inventive concept.

According to another aspect of the present invention, there is provided a method of manufacturing a flexible metal clad laminate comprising the steps of:

(a) forming a first polyimide precursor layer having a glass transition temperature of 300° C. or less after complete imidization on a metal film;

(b) forming a second polyimide precursor layer on the first polyimide precursor layer; and (c) forming a third polyimide precursor layer on the second polyimide precursor layer and then conducting of imidization to form a multilayered polyimide film.

The multilayered polyimide film satisfies following Equation 1.

$$C2 < C1 \leq C3 \qquad \text{[Equation 1]}$$

In Equation 1, C1 represents a coefficient of thermal linear expansion of a first polyimide layer obtained through imidization of the first polyimide precursor layer, C2 represents a coefficient of thermal linear expansion of a second polyimide layer obtained through imidization of the second polyimide precursor layer, and C3 represents a coefficient of thermal linear expansion of a third polyimide layer obtained through imidization of the third polyimide precursor layer.

The imidization in step (c) may be conducted by a heating with an infrared heat source. The time of heating with an infrared heat source, which is conducted at 300 or over, is 40% or over based on a total heating time.

The method may further include the step of:

(d) laminating the metal foil on the third polyimide layer included in the multilayered polyimide film in step (c).

The flexible metal clad laminate manufactured by the above-described method may satisfy following Equation 2 and Equation 3, and an ACF bonding strength may be 0.8 kgf/cm or over.

$$S_{MD} \leq 0.02 \qquad \text{[Equation 2]}$$

$$S_{TD} \leq 0.02 \qquad \text{[Equation 3]}$$

In Equation 2, $S_{MD}$ may represent a standard deviation of a dimensional change in a machine direction (MD) after heating, and in Equation 3, $S_{TD}$ may represent a standard deviation of a dimensional change in a transverse direction (TD) after heating.

In the method, the first polyimide layer may have the coefficient of thermal linear expansion of 30 to 50 ppm/K and the glass transition temperature of 200 to 300° C.

In the method, the second polyimide layer may have the coefficient of thermal linear expansion of 1 to 20 ppm/K and the glass transition temperature of 300 to 420° C.

In the method, the third polyimide layer may have the coefficient of thermal linear expansion of 30 to 70 ppm/K.

The flexible metal clad laminate according to the present invention may be manufactured by conducting a curing process in a continuous curing machine using an infrared heat source, and the appearance defects such as blistering etc. may be restrained. In addition, the generation of delamination between a metal foil and a polyimide layer, or a polyimide layer and an adjacent other polyimide layer may be prevented due to good adhesion strength. Defects of the flexible metal clad laminate generated in related arts may be remarkably solved, and a flexible metal clad laminate having a good ACF bonding strength and a good dimensional stability may be obtained.

DETAILED DESCRIPTION OF THE PREFERRED EMBODIMENT

Exemplary embodiments of the present invention will now be described in detail.

The present invention may provide a flexible metal clad laminate including a metal foil; and a multilayered polyimide film comprising a first polyimide layer having a glass transition temperature of 300° C. or less and making a contact with the metal foil, a second polyimide layer making a contact with the first polyimide layer and a third polyimide layer making a contact with the second polyimide layer. The multilayered polyimide film which is prepared by thermal imidization with an infrared heat source satisfies following Equation 1.

$$C2 < C1 \leq C3 \qquad \text{[Equation 1]}$$

In Equation 1, C1 represents a coefficient of thermal linear expansion of the first polyimide layer, C2 represents a coefficient of thermal linear expansion of the second polyimide layer, and C3 represents a coefficient of thermal linear expansion of the third polyimide layer.

The flexible metal clad laminate of the present invention may have a good ACF bonding strength and may be manufactured by using a high-speed roll-to-roll curing machine, particularly a continuous curing machine using an infrared as a heating source. In this case, the blistering or interlayer delamination possibly being generated while conducting a high temperature curing process may be restrained. Particularly, the flexible metal clad laminate according to an embodiment of the present invention may be manufactured by coating a polyamic acid resin, which is a polyimide precursor and possibly transformed into a polyimide resin, on a metal foil many times, drying and heating.

The flexible metal clad laminate according to an embodiment of the present invention has a structure satisfying the following Equation 1 and has an improved dimensional stability and ACF bonding strength when manufactured by standing for a certain time period at a high temperature range of 300° C. or over in a continuous curing machine with an infrared heat source. In this case, the blistering and the interlayer delamination may be effectively restrained during curing.

$$C2 < C1 \leq C3 \qquad \text{[Equation 1]}$$

In Equation 1, C1 represents a coefficient of thermal linear expansion of the first polyimide layer, C2 represents a coefficient of thermal linear expansion of the second polyimide layer, and C3 represents a coefficient of thermal linear expansion of the third polyimide layer.

The metal foil used in the present invention may include, without limitation, an electrodeposited copper foil, a roll and annealed copper foil, a stainless foil, an aluminum foil, a nickel foil or an alloy foil of two or more. The thickness of the metal foil is not limited, however, may be preferably 3 to 70 µm when considering the manufacturing process. In order to increase the bonding strength between metal layer and insulating layer coated thereon, a physical or chemical treatments such as a surface sanding, an electroplating of nickel or a copper-zinc alloy, coating of a silane coupling agent, etc. may be conducted.

The multilayered polyimide film formed after the imidization according to an embodiment of the present invention may be obtained by forming a precursor layer using a polyamic acid solution and then, imidization of the precursor layer. Any polyamic acid solutions commonly used in the art may be used within the technical scope of the present invention without limitation.

Particularly, the thermoplastic polyimide and the thermoplastic polyamic acid used as the constituting elements of the first polyimide layer may be a thermoplastic polyimide resin and a polyamic acid resin, without limitation, only if having a glass transition temperature (Tg) of 300° C. or less, and more preferably, 200 to 300° C., after imidization and having adhesion strength of 0.8 kgf/cm or over with a copper foil. In addition, the coefficient of thermal linear expansion of the thermoplastic polyimide of the first polyimide layer may be in a range of 30 to 50 ppm/K. Within the glass transition temperature range and the coefficient of thermal linear expansion range, a flexible metal clad laminate having an ACF bonding strength of 0.8 kgf/cm or over may be provided.

Particularly, the thermoplastic polyimide and the thermoplastic polyamic acid used as the constituting elements of the third polyimide layer in accordance with an embodiment of the present invention may be any thermoplastic polyimide resin or polyamic acid resin, without limitation, only if having a coefficient of thermal linear expansion of 30 to 70 ppm/K after being completely imidized, and having adhesion strength of 0.8 kgf/cm or over with a copper foil attached by means of a high temperature lamination method. Within the coefficient of thermal linear expansion range, a flexible metal clad laminate having a good adhesion strength with the copper foil and a good adhesion state with the copper foil may be provided.

The polyimide and the polyamic acid having a low thermal expansion property and constituting the second polyimide layer in accordance with an embodiment of the present invention may be any polyimide resin or polyamic acid resin, without limitation, only if having a coefficient of thermal linear expansion of 1 to 20 ppm/K after imidization. In addition, the glass transition temperature of the polyimide resin and the polyamic acid resin may be 300 to 420° C. The second polyimide layer having the coefficient of thermal linear expansion of 1 to 20 ppm/K and the glass transition temperature of 300 to 420° C. in accordance with an embodiment of the present invention may be positioned between the first polyimide layer and the third polyimide layer, and may keep similar coefficient of thermal linear expansion of a total polyimide film as the copper foil to restrain curl generation and to improve dimensional stability.

Methods of coating the polyamic acid solution may include a knife coating, a roll coating, a die coating, a curtain coating, etc. including any methods, without limitation, only if satisfying the object of the present invention.

Drying process after coating the polyamic acid solution may be preferably conducted by a hot air drying, preferably at 100 to 150° C. By conducting the drying process, a polyamic acid precursor layer having a film shape may be formed. Then, a heating with an infrared heat source may be conducted under a nitrogen atmosphere in a continuous curing machine including an infrared heat source to imidize the precursor film to obtain a flexible metal clad laminate.

The heating with an infrared heat source in accordance with an embodiment of the present invention may be conducted using an infrared heating machine. The main emission range of the infrared is in a wavelength range of 2 to 25 μm, and the generating method of the infrared includes various known methods, without limitation, using such as an infrared filament, an infrared emission ceramic, etc.

The heating with an infrared heat source in accordance with an embodiment of the present invention may be conducted at a temperature of 300° C. or over. The time of heating with an infrared heat source, which is conducted at 300° C. or over, is 40% or over based on a total heating time. In order to improve the defects in related arts concerning the ACF bonding strength, the inventors of the present invention have been studied on using thermoplastic polyimide having a glass transition temperature of 300° C. or less for the first polyimide layer and on solving appearance defects such as blistering, etc. As a result, the inventors found the following. That is, when the following Equation 1 is satisfactory when C1 represents the coefficient of thermal linear expansion of the first polyimide layer, C2 represents the coefficient of thermal linear expansion of the second polyimide layer, and C3 represents the coefficient of thermal linear expansion of the third polyimide layer in the multilayered polyimide film, and when a staying time period at a high temperature range of 300° C. or over in a continuous curing machine is a certain time ratio or over, the defects concerning the blistering may be solved, the dimensional stability may be improved and the ACF bonding strength may be improved to complete the present invention.

$$C2 < C1 \leq C3 \quad \text{[Equation 1]}$$

Particularly, by conducting the heating with an infrared heat source at a temperature of 300° C. or over, when the time of heating with an infrared heat source, which is conducted at 300° C. or over, is 40% or over based on a total heating time, the defects concerning the blistering may be solved, the dimensional stability may be improved and the ACF bonding strength may be improved. According to an embodiment of the present invention, the multilayered polyimide film may be imidized by the heating with an infrared heat source. The heating with an infrared heat source may be conducted at a temperature of 300° C. or over. The time of heating with an infrared heat source, which is conducted at 300° C. or over, is 40% or over, more preferably, for 40 to 70%, based on the total heating time period.

In accordance with an embodiment of the present invention, the flexible metal clad laminate may be manufactured by conducting the heating with an infrared heat source along with an auxiliary hot air heating.

In addition, a flexible metal clad laminate manufactured by laminating a metal foil on the third polyimide layer included in the multilayered polyimide film in accordance with an embodiment of the present invention may also be included in the present inventive concept. Applicable laminating methods in the present invention may include various known methods such as a high temperature roll laminating, a high temperature pressing, a high temperature belt pressing, etc.

Hereinafter, a method of manufacturing a flexible metal clad laminate in accordance with the present invention will be described.

In the present invention, a method of manufacturing a flexible metal clad laminate may be provided. The method includes the steps of:

(a) forming a first polyimide precursor layer having a glass transition temperature of 300° C. or less after complete imidization on a metal film;

(b) forming a second polyimide precursor layer on the first polyimide precursor layer; and (c) forming a third polyimide precursor layer on the second polyimide precursor layer and then conducting of imidization to form a multilayered polyimide film.

The multilayered polyimide film satisfies following Equation 1.

$$C2 < C1 \leq C3 \quad \text{[Equation 1]}$$

In Equation 1, C1 represents a coefficient of thermal linear expansion of a first polyimide layer obtained through imidization of the first polyimide precursor layer, C2 represents a coefficient of thermal linear expansion of a second polyimide layer obtained through imidization of the second polyimide precursor layer, and C3 represents a coefficient of thermal linear expansion of a third polyimide layer obtained through imidization of the third polyimide precursor layer.

After forming each of the precursor layers, an imidization process may be conducted to form the multilayered polyimide film. The imidization process may be conducted by means of a heating with an infrared heat source. In the present invention, the time of heating with an infrared heat source, which is conducted at 300° C. or over, is 40% or over based on a total heating time. Thus, the defects concerning the blistering may be solved, the dimensional stability may be improved and the ACF bonding strength may be improved to complete the present invention.

In accordance with an embodiment of the present invention, a method of manufacturing a flexible metal clad laminate further including the step of (d) laminating the metal foil on the third polyimide layer included in the multilayered polyimide film in step (c) may be provided.

In addition, the flexible metal clad laminate according to the method of an embodiment of the present invention may satisfy following Equation 2 and Equation 3, and an ACF bonding strength may be 0.8 kgf/cm or over.

$$S_{MD} \leq 0.02 \quad \text{[Equation 2]}$$

$$S_{TD} \leq 0.02 \quad \text{[Equation 3]}$$

In Equation 2, $S_{MD}$ represents a standard deviation of a dimensional change in a mechanical direction (MD) after heating, and in Equation 3, $S_{TD}$ represents a standard deviation of a dimensional change in a transverse direction (TD) after heating.

In an example embodiment, the first polyimide layer may have the coefficient of thermal linear expansion of 30 to 50 ppm/K and the glass transition temperature of 200 to 300° C.

In an example embodiment, the second polyimide layer may have the coefficient of thermal linear expansion of 1 to 20 ppm/K and the glass transition temperature of 300 to 420° C.

In an example embodiment, the third polyimide layer may have the coefficient of thermal linear expansion of 30 to 70 ppm/K.

Hereinafter, the present invention will be described referring to preferred embodiments, however, the scope of the present invention will not be limited to the following embodiments.

Before explaining the embodiments, polyamic acid which is the constituting element of the multilayered polyimide will be described. A multilayered polyimide precursor layer may be formed by using the polyamic acid, and the polyamic acid may be obtained through a synthetic method. Abbreviated compounds used for the synthesis are as follows.

DMAc: N,N-dimethylacetamide
BPDA: 3,3',4,4'-biphenyltetracarboxylic acid dianhydride
PDA: p-phenylenediamine
ODA: 4,4'-diaminodiphenylether
BAPB: 4,4'-bis(4-aminophenoxy) biphenyl
BTDA: 3,3',4,4'-benzophenonetetracarboxylic acid dianhydride
TPER: 1,3-bis(4-aminophenoxy)benzene The properties referred to in the present invention were measured by the following methods.

1. Coefficient of Thermal Linear Expansion (CTE)

The coefficient of thermal linear expansion was obtained by measuring thermal expansion values while increasing the temperature by 10° C. per minute to 400° C. by using a thermomechanical analyzer (TMA), and then, taking an average of the values measured at a temperature range of 100° C. to 200° C.

2. Tensile Modulus

The tensile modulus was measured by using a universal testing machine of Instron Co., on the basis of IPC-TM-650, 2.4.19.

3. Dimensional Change after Etching and Dimensional Change after Heating Metal Foil The dimensional change was measured according to IPC-TM-650, 2.2.4 Method B. At four vertices of a square sample having a machine direction (MD) and a transverse direction (TD) of 275×255 mm, holes for recognizing a position were formed. The sample was stored in a constant temperature, constant humidity chamber at 23° C. and 50% RH for 24 hours. Distances between holes were repeatedly measured for three times and an average was taken. Then, the metal foil was etched and stored in a constant temperature, constant humidity bath at 23° C. and 50% RH for 24 hours. Then, distances between holes were measured again. Based on the thus measured values, the change in the machine direction (MD) and the transverse direction (TD) was calculated to obtain the dimensional change after etching. The film obtained after etching the metal foil was stored in an oven at 150° C. for 30 minutes, and then was stored in a constant temperature, constant humidity chamber at 23° C. and 50% RH for 24 hours. Then, distances between holes were measured again, and the change in the MD and TD was calculated to obtain the dimensional change after heating. Ten samples taken from different positions were measured according to the same method to obtain a standard deviation of the dimensional change after heating.

4. Observation on Polyimide Appearance

A flexible metal clad laminate was cut into a square having a length and breadth of 30 cm, respectively, and the surface morphology thereof was observed. The sample was evaluated as good when blistering and delamination between the metal foil and the polyimide layer or between the polyimide layers were not observed.

5. ACF Bonding Strength

After etching the metal foil of the flexible metal clad laminate, an ACF was inserted between glasses and polyimide film and then pressurized for adhesion at 230° C. for 10 seconds with a pressure of 25 kgf/cm². Then, 90 degree peel strength was measured by using a universal testing machine of Instron Co.

6. Observation on Lamination Bubbles

The flexible metal clad laminate was cut by using an ion miller, and the interface of the copper foil and the polyimide layer was observed by a FE-SEM. The non-adhesion portion at the interface of the copper foil and the polyimide layer is a lamination bubble. It was considered as defect when the lamination bubble at the interface of the metal foil and the insulating layer had a size exceeding 10 μm, and it was considered as good when the lamination bubble exceeding 10 μm was not observed. When adjacent non-adhesion portions having a few μm size are present at the interface, the total length was measured. Thus measured value was considered as the size of the non-adhesion interface.

7. Measuring the Adhesion Strength with Copper Foil

In order to measure the adhesion strength of the polyimide layer and the copper foil, the copper foil of the flexible metal clad laminate was patterned by 1 mm width. Then, the 180 degree peel strength was measured by using a universal testing machine.

Synthetic Example 1

As shown in Table 1, into 32,416 g of DMAc solution, 1,638 g of PDA and 758 g of ODA as a diamine were added and stirred under a nitrogen atmosphere to completely dissolve. Then, 5,700 g of BPDA as a dianhydride was added by several times. The solution was stirred for about 24 hours to prepare a polyamic acid solution. This polyamic acid solution was cast to a film having a thickness of 20 μm, and a temperature was increased to 350° C. for 60 minutes and kept for 30 minutes to cure. The measured coefficient of thermal linear expansion and the glass transition temperature were 13.3 ppm/K and 321° C., respectively.

Synthetic Examples 2 to 6

The same procedure was conducted as shown in Synthetic Example 1 using the formulation shown in Table 1. The measured coefficient of thermal linear expansion and the glass transition temperature are shown in Table 1.

TABLE 1

Formulations of polyamic acid solution and coefficients of thermal linear expansion and glass transition temperature after imidization

| Division | Dianhydride 1 | Dianhydride 2 | Diamine 1 | Diamine 2 | DMAc | CTE (ppm/K) | Tg (° C.) |
|---|---|---|---|---|---|---|---|
| Synthetic Example 1 | BPDA 5,700 g | | PDA 1,638 g | ODA 758 g | 32,419 g | 13.3 | 321 |
| Synthetic Example 2 | BPDA 1,300 g | BTDA 949 g | TPER 1,300 g | PDA 319 g | 25,879 g | 42.2 | 251 |
| Synthetic Example 3 | BPDA 2,240 g | | TPER 2,226 g | | 30,780 g | 51.1 | 232 |
| Synthetic Example 4 | BPDA 1,438 g | | | BAPB 1,801 g | 21,987 g | 65.8 | 259 |
| Synthetic Example 5 | BPDA 2,350 g | | TPER 586 g | ODA 1,196 g | 27,652 g | 61.3 | 236 |
| Synthetic Example 6 | BPDA 2,000 g | | TPER 511 g | ODA 405 g | 19,512 g | 24.1 | 323 |

Example 1

On an electrodeposited copper foil (roughness Rz=2.0 μm) having a thickness of 12 μm, the polyamic acid solution prepared by Synthetic Example 2 was coated to a thickness of 4 μm after final curing, and then, dried at 130° C. to form a first polyimide precursor layer. On surface of the first polyimide precursor layer, the polyamic acid solution prepared through Synthetic Example 1 was coated to a thickness of 13 μm after final curing, and then, dried at 150° C. to form a second polyimide precursor layer. Then, on one surface of the second polyimide precursor layer, the polyamic acid solution prepared through Synthetic Example 3 was coated to a thickness of 3.5 μm after final curing, and then, dried at 150° C. to form a third polyimide precursor layer. The manufactured multilayered polyimide precursor film on the copper foil was completely imidized using curing condition 1 shown in Table 2 under a nitrogen atmosphere by using an infrared heating machine to manufacture a flexible metal clad laminate. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Example 2

On an electrodeposited copper foil (roughness Rz=2.0 μm) having a thickness of 12 μm, the polyamic acid solution prepared by Synthetic Example 2 was coated to a thickness of 3.5 μm after final curing, and then, dried at 130° C. to form a first polyimide precursor layer. On surface of the first polyimide precursor layer, the polyamic acid solution prepared through Synthetic Example 1 was coated to a thickness of 13 μm after final curing, and then, dried at 150° C. to form a second polyimide precursor layer. Then, on one surface of the second polyimide precursor layer, the polyamic acid solution prepared through Synthetic Example 2 was coated to a thickness of 4 μm after final curing, and then, dried at 150° C. to form a third polyimide precursor layer. The manufactured multilayered polyimide precursor film on the copper foil was completely imidized using curing condition 1 shown in Table 2 under a nitrogen atmosphere by using an infrared heating machine to manufacture a flexible metal clad laminate. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Example 3

The same multilayered polyimide precursor film as shown in Example 2 was manufactured and was completely imidized using curing condition 2 shown in Table 2 under a nitrogen atmosphere by using an infrared heating machine to manufacture a flexible metal clad laminate. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Example 4

On an electrodeposited copper foil (roughness Rz=2.0 μm) having a thickness of 12 μm, the polyamic acid solution prepared by Synthetic Example 2 was coated to a thickness of 3.5 μm after final curing, and then, dried at 130° C. to form a first polyimide precursor layer. On surface of the first polyimide precursor layer, the polyamic acid solution prepared through Synthetic Example 1 was coated to a thickness of 14 μm after final curing, and then, dried at 150° C. to form a second polyimide precursor layer. Then, on one surface of the second polyimide precursor layer, the polyamic acid solution prepared through Synthetic Example 4 was coated to a thickness of 3 μm after final curing, and then, dried at 150° C. to form a third polyimide precursor layer. The manufactured multilayered polyimide precursor film on the copper foil was completely imidized using curing condition 2 shown in Table 2 under a nitrogen atmosphere by using an infrared heating machine to manufacture a flexible metal clad laminate on the copper foil. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Example 5

The flexible metal clad laminate prepared in Example 2 and a copper foil of the same kind as used in Example 2 were laminated by using a high temperature laminator in a processing line speed of 3 m/min to manufacture a double sided flexible metal clad laminate including a multilayered polyimide film and two copper foils attached on both sides of the film. The adhesion strength with Cu foil and the observing results on the cross-section of flexible metal clad laminate are shown in Table 4.

Example 6

The flexible metal clad laminate prepared in Example 1 and a copper foil of the same kind as used in Example 1 were laminated by using a high temperature laminator in a processing line speed of 5 m/min to manufacture a double sided flexible metal clad laminate including a multilayered polyimide film and two copper foils attached on both sides of the film. The adhesion strength with Cu foil and the observing results on the cross-section of flexible metal clad laminate are shown in Table 4.

Example 7

The flexible metal clad laminate prepared in Example 4 and a copper foil of the same kind as used in Example 4 were laminated by using a high temperature laminator in a processing line speed of 5 m/min to manufacture a double sided flexible metal clad laminate including a multilayered polyimide film and two copper foils attached on both sides of the film. The adhesion strength with Cu foil and the observing results on the cross-section of flexible metal clad laminate are shown in Table 4.

Comparative Example 1

The same multilayered polyimide precursor film as shown in Example 1 was manufactured and was completely imidized using curing condition 3 shown in Table 2 under a nitrogen atmosphere by using an infrared heating machine to manufacture a flexible metal clad laminate on the copper foil. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Comparative Example 2

The same multilayered polyimide precursor film as shown in Example 2 was manufactured and was completely imidized using curing condition 3 shown in Table 2 under a nitrogen atmosphere by using an infrared heating machine to manufacture a flexible metal clad laminate on the copper foil. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Comparative Example 3

On an electrodeposited copper foil (roughness Rz=2.0 μm) having a thickness of 12 μm, the polyamic acid solution prepared by Synthetic Example 4 was coated to a thickness of 3.2 μm after final curing, and then, dried at 130° C. to form a first polyimide precursor layer. On surface of the first polyimide precursor layer, the polyamic acid solution prepared through Synthetic Example 1 was coated to a thickness of 14 μm after final curing, and then, dried at 150° C. to form a second polyimide precursor layer. Then, on one surface of the second polyimide precursor layer, the polyamic acid solution prepared through Synthetic Example 2 was coated to a thickness of 3.5 μm after final curing, and then, dried at 150° C. to form a third polyimide precursor layer. The manufactured multilayered polyimide precursor film on the copper foil was completely imidized using curing condition 2 shown in Table 2 under a nitrogen atmosphere by using an infrared heating machine to manufacture a flexible metal clad laminate on the copper foil. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance of the manufactured flexible metal clad laminate are shown in Table 3.

Comparative Example 4

On an electrodeposited copper foil (roughness Rz=2.0 μm) having a thickness of 12 μm, the polyamic acid solution prepared by Synthetic Example 5 was coated to a thickness of 2.7 μm after final curing, and then, dried at 130° C. to form a first polyimide precursor layer. On surface of the first polyimide precursor layer, the polyamic acid solution prepared through Synthetic Example 1 was coated to a thickness of 14 μm after final curing, and then, dried at 150° C. to form a second polyimide precursor layer. Then, on one surface of the second polyimide precursor layer, the polyamic acid solution prepared through Synthetic Example 2 was coated to a thickness of 3.5 μm after final curing, and then, dried at 150° C. to form a third polyimide precursor layer. The manufactured multilayered polyimide precursor film on the copper foil was completely imidized using curing condition 2 shown in Table 2 under a nitrogen atmosphere by using an infrared heating machine to manufacture a flexible metal clad laminate on the copper foil. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Comparative Example 5

On an electrodeposited copper foil (roughness Rz=2.0 μm) having a thickness of 12 μm, the polyamic acid solution prepared by Synthetic Example 6 was coated to a thickness of 5 μm after final curing, and then, dried at 130° C. to form a first polyimide precursor layer. On surface of the first polyimide precursor layer, the polyamic acid solution prepared through Synthetic Example 1 was coated to a thickness of 13 μm after final curing, and then, dried at 150° C. to form a second polyimide precursor layer. Then, on one surface of the second polyimide precursor layer, the polyamic acid solution prepared through Synthetic Example 3 was coated to a thickness of 3 μm after final curing, and then, dried at 150° C. to form a third polyimide precursor layer. The manufactured multilayered polyimide precursor film on the copper foil was completely imidized using curing condition 4 shown in Table 2 under a nitrogen atmosphere by using an infrared heating machine to manufacture a flexible metal clad laminate on the copper foil. In the flexible metal clad laminate, the first polyimide precursor layer is imidized to a first polyimide layer, the second polyimide precursor layer is imidized to a second polyimide layer, and the third polyimide precursor layer is imidized to a third polyimide layer. The properties and appearance state of the manufactured flexible metal clad laminate are shown in Table 3.

Comparative Example 6

On the third polyimide layer of the flexible metal clad laminate prepared in Example 2, a copper foil of the same kind as used in Example 2 was laminated by using a high temperature laminator in a processing line speed of 5 m/min to manufacture a double sided flexible metal clad laminate including a multilayered polyimide film and two copper foils attached on both sides of the film. The adhesion strength with Cu foil and the observing results on the cross-section of flexible metal clad laminate are shown in Table 4.

TABLE 2

Curing condition by using infrared heating machine

| | Processing line speed | Temperature increasing time from 150° C. to 300° C. (min) | Staying time at 300° C. or over (min) | Staying ratio at 300° C. or over (min) | Maximum curing temperature (° C.) |
|---|---|---|---|---|---|
| Curing condition 1 | 4 m/min | 2 | 3.75 | 62.5 | 390 |
| Curing condition 2 | 4 m/min | 3.25 | 2.4 | 40 | 390 |
| Curing condition 3 | 4 m/min | 4.5 | 1.25 | 20.8 | 390 |
| Curing condition 4 | 2.5 m/min | 3.2 | 5.6 | 58.3 | 395 |

TABLE 3

General properties and appearance state

| | appearance | Tensile modulus (Gpa, MD/TD) | Dimensional change after etching (%, MD/TD) | Dimensional change after heating (%, MD/TD) | Standard deviation of dimensional change after heating (MD/TD) | ACF adhesion strength (kgf/cm) |
|---|---|---|---|---|---|---|
| Example 1 | good | 5.8/5.6 | 0.03/−0.01 | 0.00/−0.02 | 0.005/0.003 | 1.06 |
| Example 2 | Good | 5.9/5.9 | 0.02/−0.01 | −0.01/−0.03 | 0.004/0.006 | 1.05 |
| Example 3 | Good | 5.8/5.8 | 0.03/0.00 | −0.01/−0.02 | 0.014/0.010 | 1.04 |
| Example 4 | Good | 5.7/5.6 | 0.04/0.03 | 0.01/0.01 | 0.012/0.009 | 0.92 |
| Comparative Example 1 | Good | 5.7/5.4 | 0.01/−0.02 | −0.06/−0.05 | 0.033/0.025 | 0.78 |
| Comparative Example 2 | Good | 5.8/5.9 | 0.00/−0.02 | −0.05/−0.04 | 0.029/0.021 | 0.75 |
| Comparative Example 3 | Bubble | — | — | — | — | — |
| Comparative Example 4 | Bubble, delamination | — | — | — | — | — |
| Comparative Example 5 | Good | 6.1/5.8 | 0.01/−0.01 | −0.01/−0.03 | 0.01/0.006 | 0.51 |

TABLE 4

General properties and appearance of double sided flexible metal clad laminate

| | Lamination Line Speed | Lamination bubble | Adhesion strength between copper foil and polyimide attached by lamination (kgf/cm) |
|---|---|---|---|
| Example 5 | 3 | Good | 1.2 |
| Example 6 | 5 | Good | 1.4 |
| Example 7 | 5 | Good | 1.5 |
| Comparative Example 6 | 5 | Bad | 1.1 |

In the flexible metal clad laminate manufactured in Examples 1 to 4, when a multilayered polyimide precursor layer is manufactured having the structure of C2<C1≤C3 when the coefficient of thermal linear expansion of the first polyimide layer is C1, the coefficient of thermal linear expansion of the second polyimide layer is C2, and the coefficient of thermal linear expansion of the third polyimide layer is C3 after complete imidization of the polyimide precursor layers attached on the copper foil, the blistering and the interlayer delamination may be prevented during conducting curing process in a continuous curing machine with an infrared heat source.

However, for the polyimide precursor layer in accordance with Comparative Examples 3 and 4, having the structure of C2<C3<C1, the appearance defects such as the blistering and interlayer delamination are generated in a continuous curing process using the infrared as the heat source.

When the heating time at a high temperature of 300° C. or over is short for the multilayered polyimide precursor layer having the structure of C2<C1≤C3, the appearance was good, however, the dimensional change, particularly, the dimensional change after heating was found to increase. In addition, the standard deviation of the dimensional change after heating was found to increase. From the results, the heating time of 40% or over based on the total heating time at 300° C. or over is found to be necessary to manufacture a flexible metal clad laminate having a good appearance, a good dimensional stability and ACF bonding strength. However, when the heating time exceeds 80% or over, the appearance defects may be generated due to the increase of the heating rate to 300° C.

From the results, it would be confirmed that when manufacturing a flexible metal clad laminate having the structure of C2<C1≤C3 when the CTE of the first polyimide layer is C1, the CTE of the second polyimide layer is C2, and the CTE of the third polyimide layer is C3 after full imidization of the polyimide precursor layers attached on the copper foil, and when conducting the heating with an infrared heat source at a temperature of 300° C. or over for the heating time of 40% or over, more preferably, 40 to 70%, based on the total heating time period, the defects concerning the blistering may be solved, the dimensional stability may be improved and the ACF bonding strength may be improved.

When thermoplastic polyimide having a glass transition temperature (Tg) of 300° C. or less is used at a surface layer making a contact with a copper foil, the bonding strength with ACF was better when comparing with the case using polyimide layer having the Tg of 300° C. or over, as confirmed through Comparative Example 5.

The CTE difference between the first polyimide layer and the second polyimide layer for a flexible metal clad laminate according to the present invention having the structure of C2<C1≤C3 when the CTE of the first polyimide layer attached on the copper foil is C1, the CTE of the second polyimide layer is C2, and the CTE of the third polyimide layer is C3 after complete imidization of the polyimide precursor layers, may be decreased when comparing with the laminate having the structure of C2<C3<C1. Thus, the defects on the appearance such as blistering may be effectively improved for the flexible metal clad laminate of the present invention. In addition, when the CTE value (C3) of the polyimide layer making a contact with a copper foil is large through lamination in Examples 5 to 7 and Comparative Example 6, the lamination line speed for manufacturing a double sided flexible metal clad laminate may be increased and the size of the lamination bubble at the non-adhesion portion between the copper foil and the polyimide may be decreased. When the CTE value (C3) of the polyimide layer making a contact with a copper foil is large, the lamination bubble may have a small size within 10 μm even though the lamination line speed is high. However, when the C3 value is small, the increase of the line speed may be limited. When the lamination bubble is formed to the size of 10 μm or over, an etching solution may penetrate into the non-adhesion portion between the copper foil and the polyimide layer during patterning process. In this case, defects may be generated while manufacturing flexible printed circuit boards.

While the present invention has been shown and described in connection with the exemplary embodiments, it will be apparent to those skilled in the art that modifications and variations can be made without departing from the spirit and scope of the invention as defined by the appended claims.

What is claimed is:

1. A flexible metal clad laminate comprising:
a metal foil; and
a multilayered polyimide film comprising a first polyimide layer having a glass transition temperature of 300° C. or less and disposed on the metal foil, a second polyimide layer disposed on the first polyimide layer and a third polyimide layer disposed on the second polyimide layer, the multilayered polyimide film satisfying following Equation 1, $$C2<C1\leq C3 \quad\quad \text{[Equation 1]}$$

in which, C1 represents a coefficient of thermal linear expansion of the first polyimide layer, C2 represents a coefficient of thermal linear expansion of the second polyimide layer, and C3 represents a coefficient of thermal linear expansion of the third polyimide layer.

2. The flexible metal clad laminate of claim 1, wherein the flexible metal clad laminate satisfies following Equation 2 and Equation 3, and an ACF bonding strength is 0.8 kgf/cm or over, $$S_{MD}\leq 0.02 \quad\quad \text{[Equation 2]}$$

$$S_{TD}\leq 0.02 \quad\quad \text{[Equation 3]}$$

in Equation 2, $S_{MD}$ represents a standard deviation of a dimensional change in a machine direction (MD) after heating, and in Equation 3, $S_{TD}$ represents a standard deviation of a dimensional change in a transverse direction (TD) after heating.

3. The flexible metal clad laminate of claim 1, wherein the first polyimide layer has the coefficient of thermal linear expansion of 30 to 50 ppm/K and the glass transition temperature of 200 to 300° C.

4. The flexible metal clad laminate of claim 1, wherein the second polyimide layer has the coefficient of thermal linear expansion of 1 to 20 ppm/K and the glass transition temperature of 300 to 420° C.

5. The flexible metal clad laminate of claim 1, wherein the third polyimide layer has the coefficient of thermal linear expansion of 30 to 70 ppm/K.

6. The flexible metal clad laminate of claim 1, wherein the multilayered polyimide film is imidized by heating with an infrared heat source, the time of heating with an infrared heat source, which is conducted at 300° C. or over, is 40% or over based on a total heating time.

7. A flexible metal clad laminate manufactured by laminating a metal foil on the third polyimide layer included in the multilayered polyimide film in claim 1.

8. A method of manufacturing a flexible metal clad laminate comprising the steps of:
  (a) forming a first polyimide precursor layer having a glass transition temperature of 300° C. or less after complete imidization on a metal film;
  (b) forming a second polyimide precursor layer on the first polyimide precursor layer; and
  (c) forming a third polyimide precursor layer on the second polyimide precursor layer and then conducting of imidization to form a multilayered polyimide film,
  the multilayered polyimide film satisfying following Equation 1, $$C2 < C1 \leq C3 \quad \text{[Equation 1]}$$

in which, C1 represents a coefficient of thermal linear expansion of a first polyimide layer obtained through imidization of the first polyimide precursor layer, C2 represents a coefficient of thermal linear expansion of a second polyimide layer obtained through imidization of the second polyimide precursor layer, and C3 represents a coefficient of thermal linear expansion of a third polyimide layer obtained through imidization of the third polyimide precursor layer.

9. The method of manufacturing a flexible metal clad laminate of claim 8, wherein the imidization in step (c) is conducted by an heating with an infrared heat source,
  the time of heating with an infrared heat source, which is conducted at 300° C. or over, is 40% or over based on a total heating time.

10. The method of manufacturing a flexible metal clad laminate of claim 8, further comprising the step of:
  (d) laminating the metal foil on the third polyimide layer included in the multilayered polyimide film in step (c).

11. The method of manufacturing a flexible metal clad laminate of claim 8, wherein the flexible metal clad laminate satisfies following Equation 2 and Equation 3, and an ACF bonding strength is 0.8 kgf/cm or over, $$S_{MD} \leq 0.02 \quad \text{[Equation 2]}$$

$$S_{TD} \leq 0.02 \quad \text{[Equation 3]}$$

in Equation 2, $S_{MD}$ represents a standard deviation of a dimensional change in a machine direction (MD) after heating, and in Equation 3, $S_{TD}$ represents a standard deviation of a dimensional change in a transverse direction (TD) after heating.

12. The method of manufacturing a flexible metal clad laminate of claim 8, wherein the first polyimide layer has the coefficient of thermal linear expansion of 30 to 50 ppm/K and the glass transition temperature of 200 to 300° C.

13. The method of manufacturing a flexible metal clad laminate of claim 8, wherein the second polyimide layer has the coefficient of thermal linear expansion of 1 to 20 ppm/K and the glass transition temperature of 300 to 420° C.

14. The method of manufacturing a flexible metal clad laminate of claim 8, wherein the third polyimide layer has the coefficient of thermal linear expansion of 30 to 70 ppm/K.

* * * * *